(12) United States Patent
Meyer et al.

(10) Patent No.: US 8,716,859 B2
(45) Date of Patent: May 6, 2014

(54) ENHANCED FLIP CHIP PACKAGE

(75) Inventors: Thorsten Meyer, Regensburg (DE); Gerald Ofner, Regensburg (DE); Bernd Waidhas, Pettendorf (DE)

(73) Assignee: Intel Mobile Communications GmbH, Neubiberg (DE)

( * ) Notice: Subject to any disclaimer, the term of this patent is extended or adjusted under 35 U.S.C. 154(b) by 9 days.

(21) Appl. No.: 13/346,993

(22) Filed: Jan. 10, 2012

(65) Prior Publication Data
US 2013/0175686 A1    Jul. 11, 2013

(51) Int. Cl.
*H01L 23/52*    (2006.01)

(52) U.S. Cl.
USPC .............. 257/738; 257/E23.01; 257/E23.021; 438/108; 438/127

(58) Field of Classification Search
USPC ............. 257/738, E23.01, E21.503, E23.021, 257/E21.508; 438/108, 127
See application file for complete search history.

(56) References Cited

U.S. PATENT DOCUMENTS

| 7,659,609 B2* | 2/2010 | Ha et al. ........................ 257/686 |
| 8,035,210 B2* | 10/2011 | Yang et al. .................... 257/686 |
| 2010/0289133 A1 | 11/2010 | Chao et al. |

FOREIGN PATENT DOCUMENTS

JP    2010 050264 A    3/2010

OTHER PUBLICATIONS

International Search Report of PCT/EP2013/050398, issued Jun. 27, 2013.

* cited by examiner

*Primary Examiner* — Zandra Smith
*Assistant Examiner* — Paul Patton (57) ABSTRACT

A flip chip package structure is proposed in which a redistribution layer (RDL) is disposed on a surface of both a semiconductor chip and one or more lateral extensions of the semiconductor chip surface. The lateral extensions may be made using, e.g., a reconstituted wafer to implement a fanout region lateral to one or more sides of the semiconductor chip. One or more electrical connectors such as solder bumps or copper cylinders may be applied to the RDL, and an interposer such as a PCB interposer may be connected to the electrical connectors. In this way, a relatively tight semiconductor pad pitch may be accommodated and translated to an appropriate circuit board pitch without necessarily requiring a silicon or glass interposer.

13 Claims, 11 Drawing Sheets

Fig. 11D though the demand for greater capabilities and features of semiconductor chips increases, so does the need for additional input/output connections (pads) to and from the semiconductor chips. There are two main known ways to deal with this. First, the semiconductor chip may be made larger to accommodate the additional pads. However, this typically results in increased manufacturing costs and undesirable increased circuit board real estate utilization. Alternatively, the semiconductor chip pad pitch may be decreased (made tighter). However, because PCB interposers are not able to handle very small interconnect pitches, flip chip packages have more recently incorporated an additional silicon or glass interposer in a "2.5D" configuration to re-map the semiconductor chip pad pitch to an intermediary pitch more suitable for the PCB interposer. Silicon and glass are used in particular, because these materials can handle very small pitches, and also because the CTEs of silicon and glass are close to the CTE of the semiconductor chip, thus allowing the connections between the semiconductor chip and the silicon or glass interposer to be very thin and reliable.

ENHANCED FLIP CHIP PACKAGE

BACKGROUND

In a typical flip chip package, a semiconductor chip is "flipped" over such that its external electrical pads face downward toward the circuit board onto which the semiconductor chip is to be connected. The typical flip chip package includes one or more interposers within the package to re-route the pads to a larger ball grid array (BGA) compatible with the larger electrical connector pitch of the circuit board. In a basic flip chip design, a single printed circuit board (PCB) interposer is used. The interposer is a PCB interposer, because the PCB materials closely match the coefficient of thermal expansion (CTE) of the circuit board onto which the flip chip is ultimately to be mounted.

As the demand for greater capabilities and features of semiconductor chips increases, so does the need for additional input/output connections (pads) to and from the semiconductor chips. There are two main known ways to deal with this. First, the semiconductor chip may be made larger to accommodate the additional pads. However, this typically results in increased manufacturing costs and undesirable increased circuit board real estate utilization. Alternatively, the semiconductor chip pad pitch may be decreased (made tighter). However, because PCB interposers are not able to handle very small interconnect pitches, flip chip packages have more recently incorporated an additional silicon or glass interposer in a "2.5D" configuration to re-map the semiconductor chip pad pitch to an intermediary pitch more suitable for the PCB interposer. Silicon and glass are used in particular, because these materials can handle very small pitches, and also because the CTEs of silicon and glass are close to the CTE of the semiconductor chip, thus allowing the connections between the semiconductor chip and the silicon or glass interposer to be very thin and reliable.

Unfortunately, silicon and glass interposers are expensive and time-consuming to manufacture, and the entire flip chip package has become significantly more complex to assemble. Moreover, by using both the silicon (or glass) interposer and the PCB interposer, three first-level interconnects and interconnections are needed. These added structural complexities may potentially result in greater manufacturing yield loss. This, combined with the greater expense, will likely make such a structure less worthwhile to build as semiconductor pad pitches continue to decrease.

SUMMARY

It is proposed that the pads of a semiconductor chip in a flip chip package may be re-mapped to a larger pitch by creating space around the semiconductor chip prior to applying one or more solder bumps or copper cylinders that connect with one or more semiconductor chip pads. To accomplish this, a redistribution layer (RDL) may be applied on a surface of both the semiconductor chip and one or more lateral extensions of the semiconductor chip surface. The lateral extensions may be made using, e.g., a reconstituted wafer to implement a fanout region lateral to one or more sides of the semiconductor chip. Then, the solder bumps or copper cylinders (and/or another first-level interconnect structure) may be applied to the RDL, which may have a larger pad pitch than the semiconductor chip. The larger pad pitch may be suitable for accepting by a PCB interposer or other interposer, as desired.

In this way, the expensive silicon or glass interposer that is traditionally used in high-pad-pitch flip chip packages may potentially be eliminated. Moreover, such a proposed flip chip device may be manufactured using the standard materials and design rules as used in conventional flip chip devices, and using conventional semiconductor die sizes, except that the silicon or glass interposer may no longer be needed and may instead be replaced with an added/artificial fanout region lateral to one or more sides of the semiconductor chip. This may further allow the number of layers in the flip-chip package to be reduced, thereby potentially further reducing cost. Because the added fanout region may extend the area of the semiconductor chip to a desired area, any number of input/output connections for a given chip size may be accommodated into the flip-chip package.

Accordingly, some aspects as described herein are directed to various semiconductor devices. For example, a semiconductor device may be provided that comprises a first semiconductor chip having at least one electrically conductive contact at a first side of the first semiconductor chip, and an extension layer extending laterally from one or more sides of the first semiconductor chip. A redistribution layer may be disposed on a surface of the extension layer and the first side of the first semiconductor chip, and the redistribution layer may be electrically coupled to the at least one electrically conductive contact of the first semiconductor chip. An interposer may have at least one electrically conductive contact at a first surface of the interposer and at least one electrically conductive contacts at an opposite second surface of the interposer, the at least one electrically conductive contact at the first surface of the interposer being electrically coupled to the redistribution layer. A molding material may at least partially enclose the first semiconductor chip and the redistribution layer, and may further be in physical contact with the interposer.

As another example, such a semiconductor device may comprise a first semiconductor chip having at least one electrically conductive contact at a first side of the first semiconductor chip, and an extension layer extending laterally from one or more sides of the first semiconductor chip. A redistribution layer may be disposed on a surface of the extension layer and the first side of the first semiconductor chip, and the redistribution layer may electrically couple the at least one electrically conductive contact to at least one electrical connector. An interposer may be electrically coupled to the at least one electrical connector and may have a plurality of electrically conductive contacts at a surface of the interposer facing away from the redistribution layer. A ball grid array may be disposed on the plurality of electrically conductive contacts of the interposer.

Further aspects may be directed to, for example, methods for manufacturing a semiconductor device or a batch of semiconductor devices. Such a method may include, for example, forming a redistribution layer on a surface of a layer that comprises a first semiconductor chip and an extension layer, wherein the redistribution layer extends beyond a boundary of the first semiconductor chip, and forming a plurality of electrical connectors on the redistribution layer, wherein some of the electrical connectors are within a boundary of the first semiconductor chip and others of the electrical connectors are disposed outside of the boundary of the first semiconductor chip. The method may further comprise connecting an interposer to the plurality of electrical connectors, and forming a ball grid array on a surface of the interposer that is opposite the plurality of electrical connectors.

As another example, such a method of manufacturing may comprise forming a redistribution layer on a surface of a reconstituted wafer, the reconstituted wafer comprising at least a plurality of semiconductor chips, wherein for each of the semiconductor chips, the redistribution layer extends beyond a boundary of the semiconductor chip. A plurality of electrical connectors may be formed on the redistribution layer, wherein for each of the semiconductor chips, some of the electrical connectors are within the boundary of the semiconductor chip and others of the electrical connectors are disposed outside of the boundary of the semiconductor chip. The reconstituted wafer may be separated into a plurality of parts, each of the parts comprising at least one of the semiconductor chips and the respective electrical connectors for those at least one of the semiconductor chips. For each of the parts, an interposer may be connected to the plurality of electrical connectors, and a ball grid array may be formed on a surface of the interposer that is opposite the plurality of electrical connectors.

These and other aspects of the disclosure will be apparent upon consideration of the following detailed description.

BRIEF DESCRIPTION OF THE DRAWINGS

A more complete understanding of the present disclosure and the potential advantages of various aspects described herein may be acquired by referring to the following description in consideration of the accompanying drawings, in which like reference numbers indicate like features, and wherein:

FIGS. 2A and 2B are side cutaway views of additional examples of a semiconductor device in accordance with one or more aspects described herein;

It is noted that one or more of the drawings may not necessarily be drawn to scale.

DETAILED DESCRIPTION

Figure 1A:
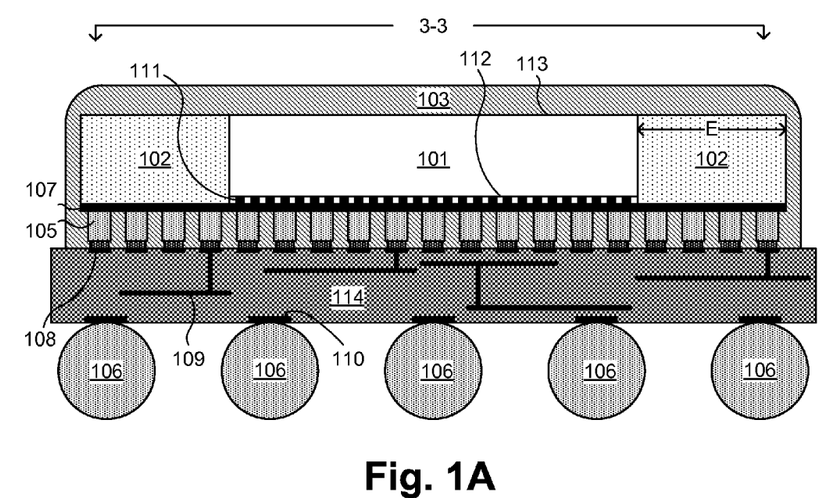
FIGS. 1A and 2B are side cutaway views of examples of a semiconductor device in accordance with one or more aspects described herein.

FIG. 1A is a side cutaway view of an example semiconductor device in accordance with one or more aspects described herein. The semiconductor device of FIG. 1A may include a semiconductor chip or die 101 that comprises one or more active and/or passive components, such as electrical and/or optical components. For example, the semiconductor chip 101 may include components such as one or more resistors, transistors, capacitors, diodes, and/or memory cells, with one or more conductive lines interconnecting the same.

The semiconductor device of FIG. 1A (as well as the devices of FIGS. 1B, 2A, 2B, 3, and 5-10) may be considered a flip-chip package, and accordingly the semiconductor chip 101 may be oriented in what is commonly referred to as a flip-chip configuration relative to the remainder of the semiconductor device. In such a flip-chip configuration, one or more electrically conductive contacts (e.g., pads) 111 on or otherwise at a first surface 112 of the semiconductor chip 101 face downward in FIG. 1A. The conductive pads 111 allow the semiconductor chip 101 to electrically communicate with other portions of the semiconductor device. The semiconductor chip 101 may be at least partially surrounded in one or more lateral directions by an extension layer 102. The extension layer 102 may be made of a plastic material, mold compound, or other non-conductive material, and may be directly adjacent to and/or in contact with one or more lateral sides of the semiconductor chip 101. The extension layer 102 may artificially extend the surface area of the semiconductor chip 101, and may be made of a material different than the material of the semiconductor chip 101. In doing so, the extension layer 102 may extend the area of the lower surface 112 of the semiconductor chip 101 by an area that may be flush (at the same level) and/or continuous with the lower surface 112 of the semiconductor chip 101. However, the lower surface of the extension layer 102 may be at a slightly different level than the lower surface 112 of the semiconductor chip 101, if desired.

The pads 111 of the semiconductor chip 101 may be electrically coupled to one or more conductive electrical connections of a redistribution layer (RDL) 107. The RDL 107 may be disposed on the underside of at least a portion of the chip 101 and on the underside of at least a portion of the extension layer 102. The RDL 107 may be further electrically coupled to (for instance, in direct electrical contact with) a first-level interconnect, illustrated in this example as one or more electrical connectors that may be in the form of, e.g., copper cylinders 105, or in the example of FIG. 1B, solder bumps 115.

Figure 1B:
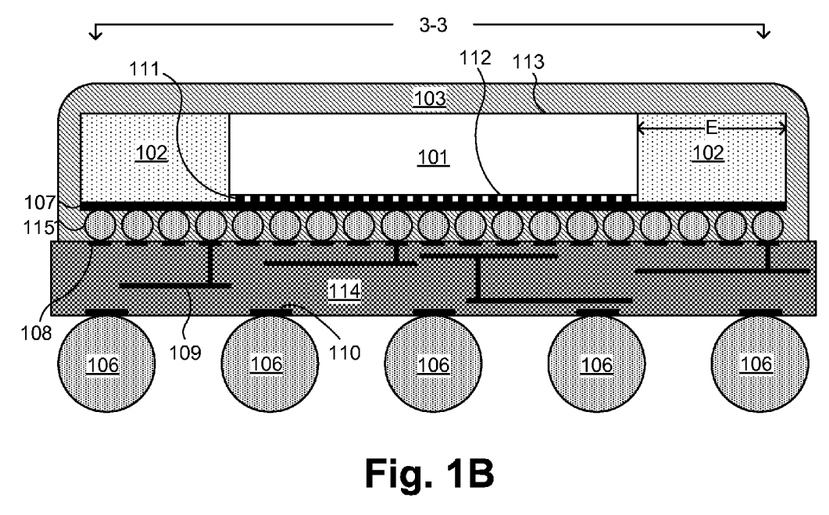

The electrical connectors 105/115 may, in turn, be electrically coupled to (for instance, in direct electrical contact with) an interposer 114. The interposer 114 may redistribute and/or re-map connections from the electrical connectors 105/115 to a ball grid array (BGA) of solder balls 106 disposed on the underside of the interposer 114. The BGA may, in turn, be electrically coupled to (e.g., soldered to) a circuit board such as a PCB board. Thus, the example semiconductor devices described herein may be placed on a circuit board as part of a larger circuit and/or device.

The interposer 114 may have one or more electrical contacts 108 (e.g., pads) at an upper surface of the interposer 114 that are electrically coupled (and in physical contact) with the electrical connectors 105/115. The interposer 114 may further have one or more electrical contacts 110 at an opposite lower surface of the interposer 114 that are electrically coupled (and in physical contact) with the solder balls 106 of the BGA. As can be seen from the figures, the contacts 108 and 110 may be distributed over a surface area that is larger than the surface area over which the pads 111 are distributed (e.g., larger than the surface area of the semiconductor chip 101). Thus, at least some of the contacts 108 and 110 may be disposed underneath the extension layer 102 but not underneath the semiconductor chip 101.

The electrical contacts 108 and the electrical contacts 110 may be interconnected by a one or more interconnects 109 disposed fully or partially within the interposer 114. The interconnects 109 may carry electrical signals from one or more of the electrical contacts 108 to one or more of the electrical contacts 110, and/or vice-versa, as desired. As will be discussed further below, the electrical contacts 110 may be arranged on the interposer 114 so as to have a pitch that is equal to or lower (sparser) than the pitch of the electrical contacts 108. The respective quantities of the electrical contacts 108 and 110 may or may not be equal.

The extension layer 102 may extend from the side(s) of the semiconductor chip 101 in one or more lateral directions by a non-zero distance E. The distance E may depend upon the area of the semiconductor chip 101, the pad pitch of the semiconductor chip 101, the quantity of the pads 111, a number of the electrical contacts 108, and/or a desired pitch of the electrical contacts 108. Since the total surface area provided by the extension layer 102 combined with the semiconductor chip 101 will be increased as compared with only the surface area of the semiconductor chip 101, this may allow for the pitch of the electrical contacts 108 to be lower than the pitch of the pads 111. Where the pitch of a two-dimensional array of pads or other elements is referred to herein, this may refer to the pitch in each of two orthogonal directions defined by the array (such as rows and columns). The pitch in the two directions may or may not be the same for a given array.

The interposer 114 may be made of, or otherwise include, a printed circuit board (PCB), and may be formed as a dielectric substrate on and/or in which electrically conducting layers may be formed to provide the above-mentioned interconnects 109. For example, the interposer 114 may be formed of a network of the conducting layers that are made of thin copper or other metal foil and that are embedded into and/or patterned onto dielectric materials such as polytetrafluoroethylene (TEFLON), resin bonded paper, cotton paper and epoxy, or glass and epoxy. To provide a potentially more reliable device, the material(s) of the interposer 114 may be selected to have a coefficient of thermal expansion (CTE) close to that of the PCB onto which the ball grid array 106 is to be soldered. In doing so, this may reduce the possibility of the interposer 114 and the PCB board external to the semiconductor device pulling away from each other and potentially causing circuit disconnections or short-circuiting due to environmental temperature variations. The interposer 114 may be made of other materials, such as low temperature co-fired ceramic (LTCC), high temperature co-fired ceramic (HTCC), or flexible substrate material (e.g. polyimide foil, PET foil), if desired, however it believed that PCB may be a more cost-effective material, especially because this material is relatively inexpensive and is already being used in conventional flip-chip devices.

At least a portion of the semiconductor device may also be covered and/or filled with an underfill material 103 to potentially provide protection from external forces and/or to potentially prevent temperature changes (and any differences in the various CTEs of the elements of the semiconductor device) from causing cracking or separation of the various elements of the semiconductor device. The underfill material 103 may be made of any non-conductive material, such as plastic. The underfill material 103 may be partially or fully disposed, for example, on an upper surface 113 of the semiconductor chip 101, an upper surface of the extension layer 102, the sides of the extension layer 102, and/or in the otherwise empty region between the RDL 107 and the interposer 114. The underfill material 103 may further be partially or fully disposed on the sides of the interposer 114, if desired. Any types of underfill materials may be used, such as capillary flow underfill, molded underfill, pre-applied (no-flow-) underfill, or wafer level underfill.

Figure 2A:
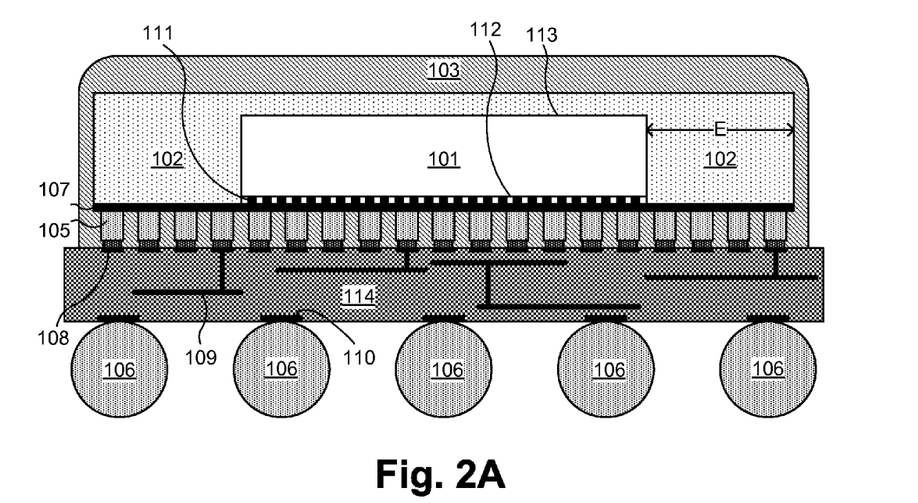
Figure 2B:
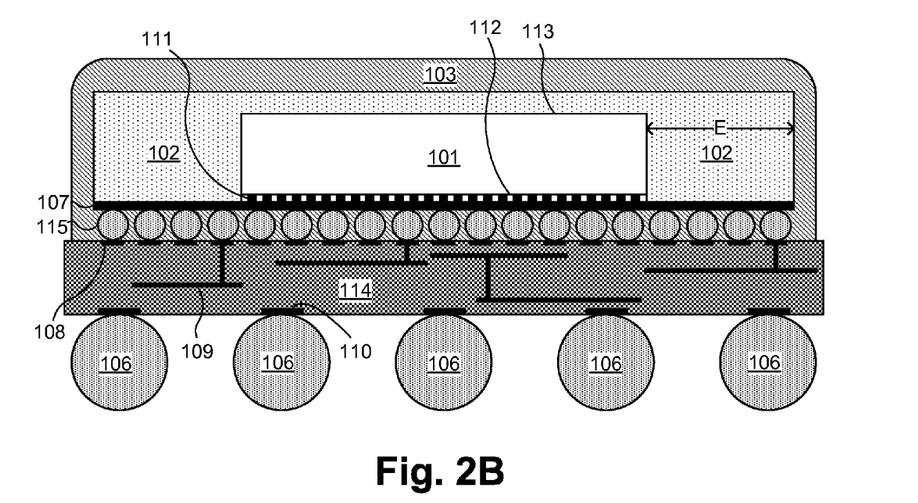

In the examples of FIGS. 1A and 1B, the extension layer 102 does not cover the upper surface 113 of the semiconductor chip 101. This may be desirable, as it may prevent or reduce any bi-metal effects between the extension layer 102 and the surface 113 of the semiconductor chip 101 that might otherwise exist. However, if desired, the extension layer 102 may partially or completely cover the surface 113 of the semiconductor chip 101. FIGS. 2A and 2B, which correspond respectively to FIGS. 1A and 1B, show examples of such a configuration.

Figure 3:
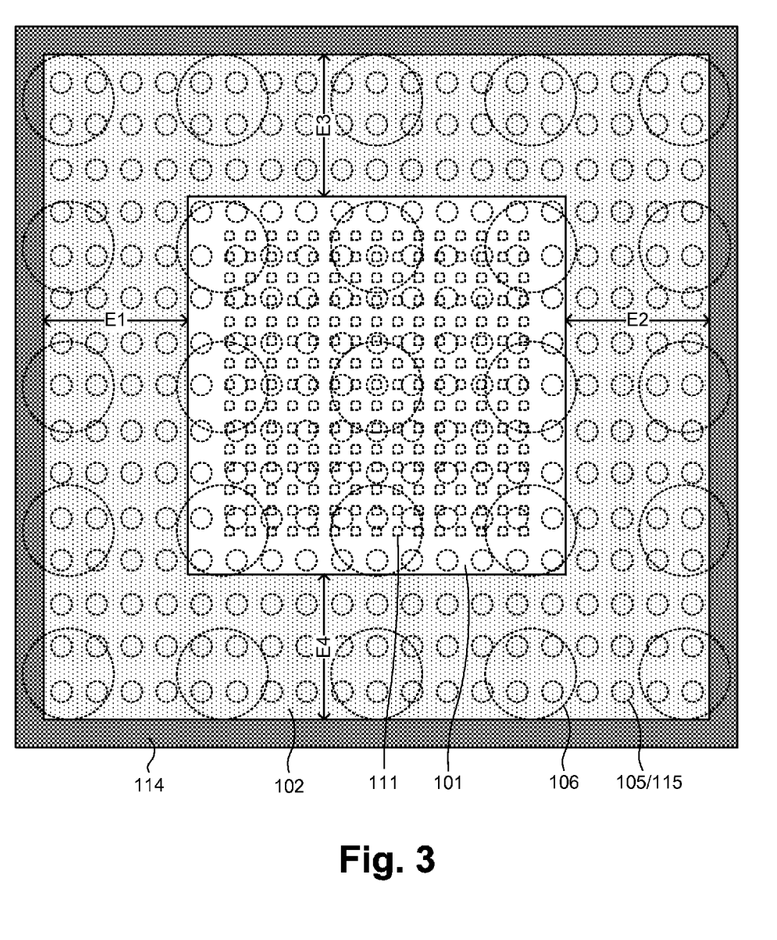
FIG. 3 is a top plan view of the semiconductor device of either FIG. 1A or FIG. 1B.

The laterally extending nature of the extension layer 102 is also shown by way of example in the top plan view of FIG. 3 (viewed from point of view 3-3 as indicated in FIGS. 1A and 1B). FIG. 3 may also apply to the examples of FIGS. 2A and 2B, except that the extension layer 102 would also be shown to cover the otherwise exposed surface of the semiconductor chip 101. In this FIG. 3 example, the extension layer 102 extends symmetrically in all four lateral directions (up, down, left, and right in the view of FIG. 3). However, the extension layer 102 may alternatively extend symmetrically or asymmetrically in only one, two, or three of the directions. As also shown in FIG. 3, the extension layer 102 may extend in any one or more of the four directions by respective distances E1, E2, E3, and E4, which may each be zero or any non-zero distance as desired. While distances E1, E2, E3, and E4 may each be the same amount of distance, they may also be different from each other. For instance, distances E1 and E2 may be non-zero (and may be equal to each other) while distances E3 and E4 may be both zero.

As is also apparent from the example of FIG. 3, the electrical connectors 105/115 may extend laterally in one or more directions from the underside of the semiconductor chip 101. For example, the electrical connectors 105/115 may be distributed across the combined lateral area defined by the semiconductor chip 101 and the extension layer 102. This means that, while the pads 111 of the semiconductor chip 101 may be distributed within the smaller lateral area of the semiconductor chip 101, the electrical connectors 105/115 may be provided a larger area in which to be distributed. Therefore, where the quantity of the pads 111 and the quantity of electrical connectors 105/115 are the same or are similar, the electrical connectors 105/115 may be able to be provided at a lower pitch than the pitch of the pads 111. As will be described, the pitch of the pads 111 of the semiconductor chip 101 may be distributed at a first pitch, the pitch of the electrical connectors 105/115 may be distributed at a second pitch that is lower (sparser) than the first pitch, and the solder balls 106 of the BGA may be distributed at a third pitch that is lower (sparser) than the second pitch. In this way, the semiconductor chip 101 may be made relatively small in area, with a relatively large number of pads 111, and the semiconductor device (e.g., of FIG. 1A, 1B, 2A, 2B, or 3) may re-map the pitch of pads 111 (the first pitch) to an intermediary pitch (the second pitch), and may further re-map the second pitch to the third pitch of the solder balls 106 so as to be appropriate for use as a BGA on a standard flip chip pad array of a customer PCB board (for example).

The first, second, and third pitches may be any pitches desired. For example, the first pitch (the pitch of the pads 111 of the semiconductor chip 101) may be in the range of 80 microns to 150 microns, in the range of 80 micron to 120 micron pitch, below 120 micron pitch, or below 100 micron pitch. The second pitch (the pitch of the electrical connectors 105/115) may be in the range of 100 micron pitch to 150 micron pitch, in the range of 100 micron pitch to 200 micron pitch, in the range of 120 micron pitch to 200 micron pitch, at least 150 micron pitch, or at any pitch greater than the first pitch and less than (or equal to) the third pitch. The third pitch (the pitch of the solder balls 106 of the BGA) may be at any pitch greater than or equal to the second pitch, such as at least 400 micron pitch, in the range of 400 micron pitch to 500 micron pitch, or in the range of 300 micron pitch to 600 micron pitch. As a non-limiting example, the RDL 107 may re-route the pads 111 at a pitch of in the range of 80 to 120 microns, to the electrical connectors 105/115 at a larger pitch in the range of 120 to 150 microns. The interposer 114, in turn, may re-route the pitch of the electrical connectors 105/115 to the solder balls 106 of the BGA at a pitch of between 400 and 500 microns.

Thus, the semiconductor device may convert the pitch of the pads 111 of the semiconductor chip from a smaller pitch to a larger pitch that may be suitable for attachment to a PCB board of a consumer device such as a cellular telephone or computer. In many cases, PCB boards contain arrays for accepting flip chip package BGAs. Such arrays often have pads with a pitch in the range of 400 microns to 500 microns. Thus, if the pad 111 pitch of the semiconductor chip 101 is, say, less than 100 micron pitch, the RDL may re-map the pad pitch to an electrical connector 105/115 to a larger/lower intermediary pitch, and the interposer 114 may re-map that electrical connector 105/115 pitch to a still larger/lower pitch, say, in the range of 400 micron pitch to 500 micron pitch, in order to appropriately fit the solder balls 106 of the BGA on the pad array of the above-mentioned PCB board.

It is further noted that, conventionally, solder bumps are not realizable with acceptable yield at pitches below about 120 microns due to the high risk of solder briding, and so instead copper cylinders are typically used. However, copper cylinders are generally more expensive and less reliable to manufacture than solder bumps. For instance, copper cylinders typically require more accurate picking and placing to properly align the cylinders than do devices utilizing solder bumps. By extending the RDL 107 to the extension layer 102 as described herein, the larger surface area of the RDL 107 may allow a pitch for the electrical connectors 105/115 to be provided that is large enough to allow solder bumps to be used (e.g., about 150 micron pitch). This may be true even where the pitch of the pads 111 of the semiconductor chip 101 are below 120 microns in pitch. It may be desirable, therefore, to use an embodiment such as that of FIG. 1B, in which the solder bumps 115 are used between the RDL 107 and the interposer 114, rather than the copper cylinders 105. However, either type of electrical connector may be used in any embodiment and with any pitch, if desired and workable.

All ranges and values listed herein are merely examples and should not be considered limiting to the disclosure herein—the various pitches may be of any values desired. Also, while a particular array or row of elements (pads 111, electrical connectors 105/115, solder balls 106) may be represented herein as having a particular pitch, not all of those elements need be arranged in accordance with the pitch. For instance, a subset of the elements may be spaced further apart (at a greater pitch) than others in the array or row, or may be otherwise spaced unevenly.

Figure 4A:
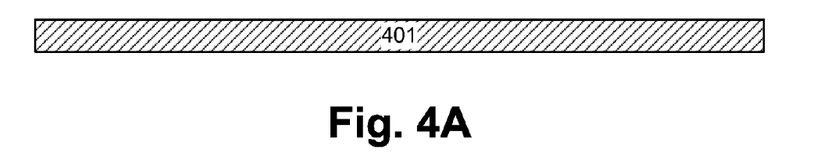
FIGS. 4A-4N are side cutaway views showing examples of a set of semiconductor devices during various steps of a manufacturing process in accordance with one or more aspects described herein.
Figure 4B:
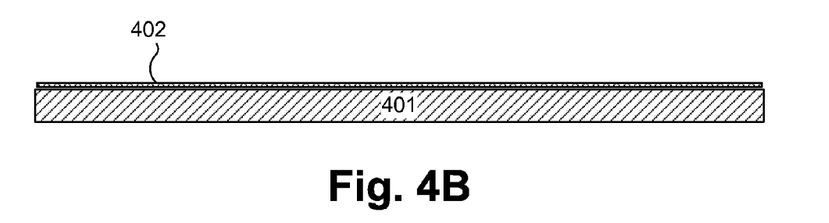
Figure 4C:
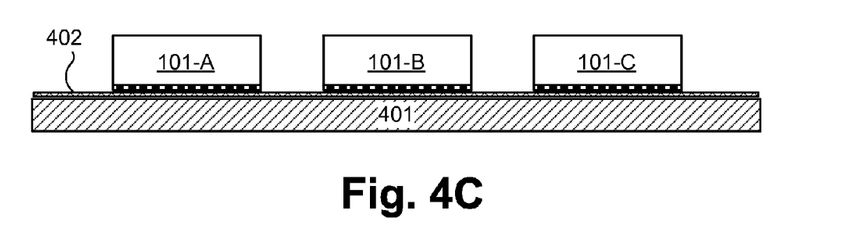
Figure 4D:
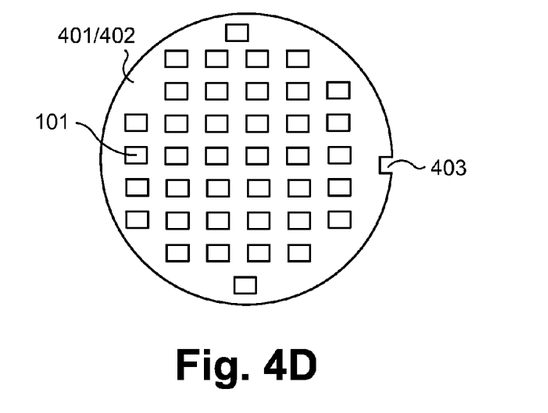
Figure 4E:
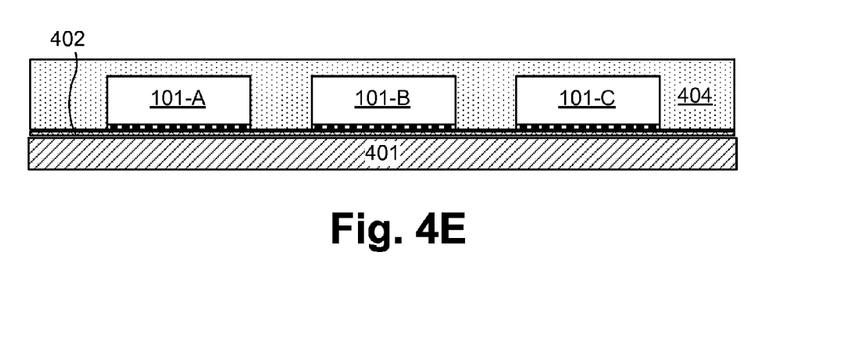
Figure 4F:
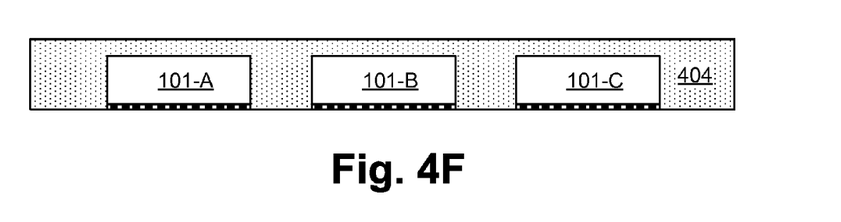
Figure 4G:
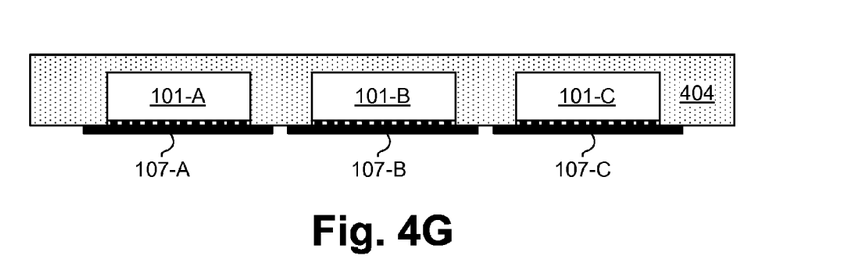
Figure 4H:
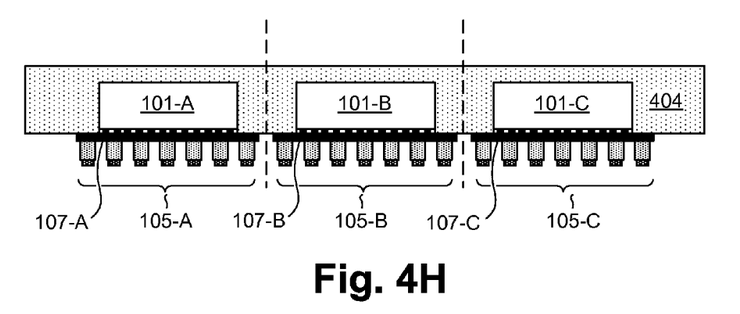
Figure 4I:
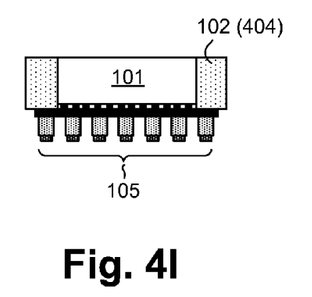
Figure 4J:
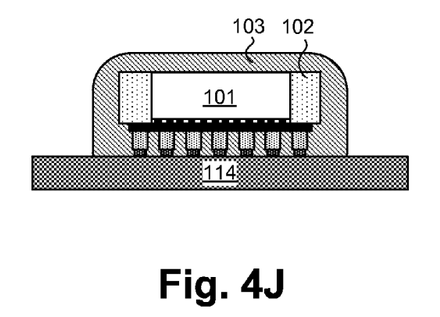
Figure 4K:
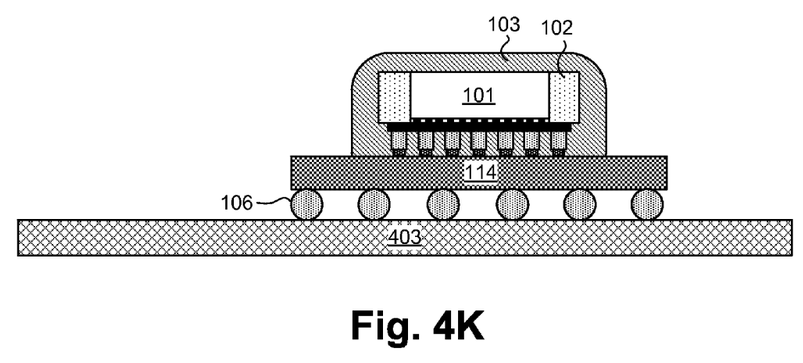
Figure 4L:
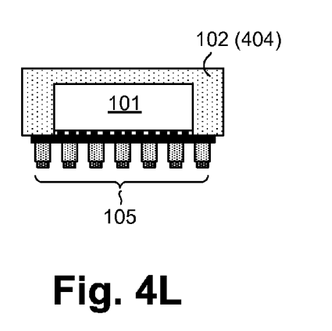
Figure 4M:
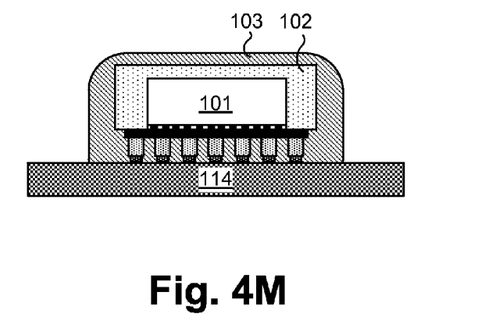
Figure 4N:
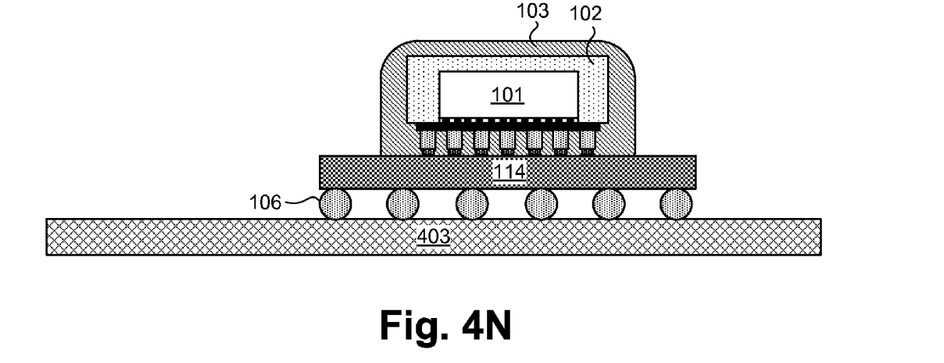

FIGS. 4A-4N are side cutaway views showing examples of a set of semiconductor devices during various steps of a manufacturing process. The set of semiconductor devices may be at least partially manufactured on a common carrier, and may be later separated from one another for further manufacturing. The various steps described in connection with FIGS. 4A-4N may be used for manufacturing, for instance, the semiconductor devices of FIGS. 1-3 and 5-10. However, these semiconductor devices may be manufactured by alternative processes as desired.

Referring to FIG. 4A, a carrier 401 may be provided, onto which the semiconductor device may be at least partially built. The carrier 401 may be made of any material, such as metal, silicon, or a polymer. Next, referring to FIG. 4B, an adhesive layer 402 may be applied to a top surface of the carrier 401. The adhesive layer 402 may be, for example, a foil with adhesive properties on both sides of the foil. The adhesive layer 402 may be provided such that the adhesive layer 402 is later releasable (i.e., not permanently adhesive), such as by the addition of energy in any form.

Next, referring to FIG. 4C, for each of the semiconductor devices to be simultaneously manufactured on the carrier 401, the previously-mentioned semiconductor chip 101 (which may have already been front-end tested) may be picked and placed so as to be attached to the adhesive layer 402. In this example, each of the semiconductor chips 101 are labeled with reference numbers 101-A, 101-B, 101-C, etc., in order to distinguish between each of the semiconductor devices being simultaneously manufactured on the same carrier 401. These will also be referred to herein collectively as the semiconductor chips 101. The various semiconductor chips 101 may all be the same type, size, and configuration of semiconductor chip, or they may be of different types, sizes, and/or configurations. The semiconductor chips 101 may be placed onto the adhesive layer 402 such that their pads 111 are facing, and, possibly in contact with, the adhesive layer 402. In other words, the semiconductor chips 101 may be placed in a flip-chip configuration down onto the adhesive layer 402 and the carrier 401.

As shown in FIG. 4D, the carrier 401 and the adhesive layer 401 may be formed in the shape of, e.g., a circle with a notch 403, such as in the shape and size of a standard silicon wafer. The notch 403 may be used to align the carrier 401 with respect to various items of manufacturing equipment during any of the example manufacturing steps described herein. Any other formats of the carrier 401, such as rectangular, square, or another shape may alternatively be used. While notch 403 may be used as a rotation indicator, any other type of rotation indicator may be used, such as holes, marks, ID chips, placed marks, etc.

Next, referring to FIG. 4E, an overmolding layer 404 may be formed over the semiconductor chips 101 and onto the exposed surface of the adhesive layer 402, which will be used to form the extension layers 102. The overmolding layer 404 may be, for instance, a non-conductive standard plastic mold compound typically used in semiconductor device manufacturing. The mold compound may be in the form of, for example, a paste-like substance that may be pressed downward under pressure to fill in the gaps between the semiconductor chips 101. Such overmolding is commonly used in the making of reconstituted wafers. The mold compound may be dispensed, for example, as a liquid in the center of a mold tool and may compressed using compression molding. This compression may cause the mold compound to flow towards the edges of the wafer and/or mold tool. To allow for the mold compound to flow over the semiconductor chips 101, a gap may be provided between the upper surfaces of the semiconductor chips 101 and the mold tool. As a result of this flow, the overmolding layer 404 may remain on the semiconductor chip 101, such as shown in FIG. 4E. The overmolding layer 404 may be eliminated (e.g., by grinding) to remove or reduce potential bi-metal effects at the interfaces between the overmolding layer 404 and the semiconductor chips 101. However, the overmolding layer 404 may also not be removed from the semiconductor chips 101, and may remain to at least partially cover the semiconductor chips 101 in the final products if desired.

Next, referring to FIG. 4F, the adhesive layer 402 and the carrier 401 may be removed from the overmolding 404 and the semiconductor chips 101. Upon such removal, the pads 111 of each of the semiconductor chips 101 may be exposed (albeit the pads 111 may be covered by a thin layer of aluminum oxide or titanium nitride, for example). The resulting combination of the overmolding 404 and the semiconductor chips 101 may be considered a reconstituted wafer. The reconstituted wafer may have a shape such as shown in FIG. 4D, or another shape.

Next, referring to FIG. 4G, a dielectric layer may be applied to the bottom of the reconstituted wafer, including the pads 111. If such a dielectric layer is added, the dielectic layer may be made of a material such as polyimide, PBO, BCB, Epoxy, or laminated film (e.g., ABF). The dielectric layer, if applied, may be structured so as to expose the pads 111, such as by photolithography or via a laser. Then the RDL 107 may be formed on the exposed semiconductor chips 101 and the exposed overmolding 404 (where the structured dielectric layer, if any, may be disposed between the RDL 107 and the semiconductor chips 101 and between the RDL 107 and the overmolding 404. The dielectric layer, if any, may be disposed between the reconstituted wafer and the RDL 107 and/or a solder stop layer on top of the RDL 107 defining the landing area for the plurality of electrical connectors. In this example, each of the RDLs 107 are labeled with reference numbers 107-A, 107-B, 107-C, etc., in order to distinguish between each of the semiconductor devices being simultaneously manufactured on the same carrier 401. These will also be referred to herein collectively as the RDLs 107. The RDLs 107 may be formed and aligned in such a manner that the exposed electrical pads of the RDLs 107 are electrically coupled to the appropriate pads 111 of the respective semiconductor chips 101. The RDLs 107 may be formed by, for example, the use of standard sputtering, plating resist, electroplating, stripping, etching, electro-less processes, dispensing, and/or printing that may be commonly used to form redistribution layers. However, in the present example, the RDLs 107 may each extend beyond the lateral boundaries of the respective semiconductor chips, extending onto the underside of the overmolding 404 as shown in FIG. 4G. Moreover, electrically conductive pads on the underside of the RDLs 107 may be formed such that the electrically conductive pads (which are to be later coupled to the electrical connectors 105/115) are disposed both underneath the respective semiconductor chips 101 and underneath the overmolding 403 surrounding each of the semiconductor chips 101.

Next, referring to FIG. 4H, the electrical connectors 105 or 115 may be applied to the RDLs 107. In this example, each of the electrical connectors are labeled with reference numbers 105-A, 105-B, 105-C, etc., in order to distinguish between each of the semiconductor devices being simultaneously manufactured on the same carrier 401. These will also be referred to herein collectively as the electrical connectors 105 (or 115, depending upon whether copper cylinders or solder bumps are used as the electrical connectors). Where the electrical connectors are copper cylinders 105 (such as in FIG. 1A), the copper cylinders 105 may be applied by, e.g., electroplating such as by re-using the seed layer previously used for creating the RDLs 107 at desired locations on the RDLs 107. Solder, tin, any other solderable material or alloy may then be applied to the exposed tip of each copper cylinder 107. Methods for creating such material-tipped copper cylinders are well-known in the art. Where the electrical connectors 115 are solder bumps 115, the solder bumps 115 may be applied to the desired locations of the RDLs 107 such as in a conventional way (e.g., by plating or printing). A solder stop layer may be provided between the RDLs 107 and the solder bumps 115. While FIGS. 4H-4N show manufacturing steps in which copper cylinders 105 are used, solder bumps 115 or other types of electrical connectors may alternatively be used for these same manufacturing steps.

The various semiconductor devices 101 may then be separated from one another into s plurality of parts, such as by dicing the reconstituted wafer. When separating the semiconductor devices 101, the separations may be made at locations between the RDLs 107, such as shown by way of the vertical broken lines in FIG. 4H. The locations of separation may be made between the respective RDLs 107, such that each part retains intact at least one of the semiconductor chips 101 and their respective RDL 107 and electrical connectors 105/115.

An example of a resulting separated semiconductor device is shown in FIG. 4I. As mentioned previously, prior to separation, the overmolding 404 covering the semiconductor chip 101 may be fully or partially removed (e.g., thinned) such as by grinding. This may be desirable as it may eliminate any bi-metal warping effect caused by the excess overmolding 404 that might otherwise exist. FIGS. 4I-4K show an example where the overmolding 404 is removed in this manner. FIGS. 4L-4N correspond to FIGS. 4I-4K, except that the overmolding 404 over the semiconductor chip 101 has not been eliminated. In either case, upon separation, the remaining portion(s) of the overmolding 404 that extend laterally from the side(s) of the semiconductor chip 101 may now be considered to be the previously-described extension layer 102. Thus, FIG. 4I shows a portion of the example semiconductor device that was previously described and illustrated with respect to FIG. 1A.

Next, as shown in FIG. 4J, the previously-described interposer 114 may be applied to the exposed copper cylinders 105 (or solder bumps 115), such that the copper cylinders 105 or solder bumps 115 are electrically connected to desired locations of the interposer 114. Moreover, the previously-described underfill material 103 may be applied to the semiconductor device so as to fill desired regions of the semiconductor device. The underfill material 103 may improve the board level temperature cycling performance by, e.g., transforming any CTE differential shear forces between the semiconductor chip 101 and the interposer 114 into bending forces.

Next, as shown in FIG. 4K, the solder balls 106 of the BGA may be applied to desired locations on the underside of the interposer 114. The resulting semiconductor device may then be applied to a desired location of a circuit board 403, such as a PCB circuit board. This may be accomplished by, for instance, locating the BGA solder balls 106 on the desired location of the circuit board 403 and heating the solder balls 106 in order to sufficiently melt the solder balls 106 onto the appropriate electrical pads of the circuit board 403. After the solder balls 106 have cooled (and possibly after any other circuit board elements have been applied as desired), the semiconductor device may be tested in situ on the circuit board 403.

Thus far, various example embodiments have been discussed in which the interposer 114 has functioned merely as a connection re-mapping element. It is also possible that the interposer 114 may include one or more passive and/or active circuit components (such as capacitors, resistors, transistors, diodes, and/or memory cells). The components included in the interposer 114 may be embodied as individual components and/or as collections of smaller components packaged together. Moreover, because the interposer 114 is adjacent to the RDL 107, the one or more circuit components may be embedded into the interposer 114 such that electrical contacts of those embedded circuit components may directly face electrical connectors 105/115 to connect to the RDL 107. Various example embodiments of semiconductor devices with an interposer 114 having one or more circuit components will now be discussed.

Figure 5:
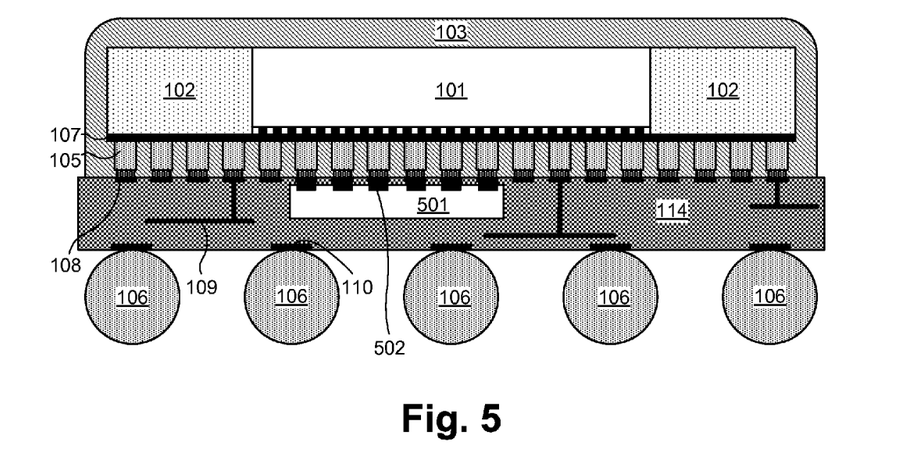
FIG. 5 is a side cutaway view of an example of a semiconductor device including an interposer-embedded device, in accordance with one or more aspects described herein.
Figure 6:
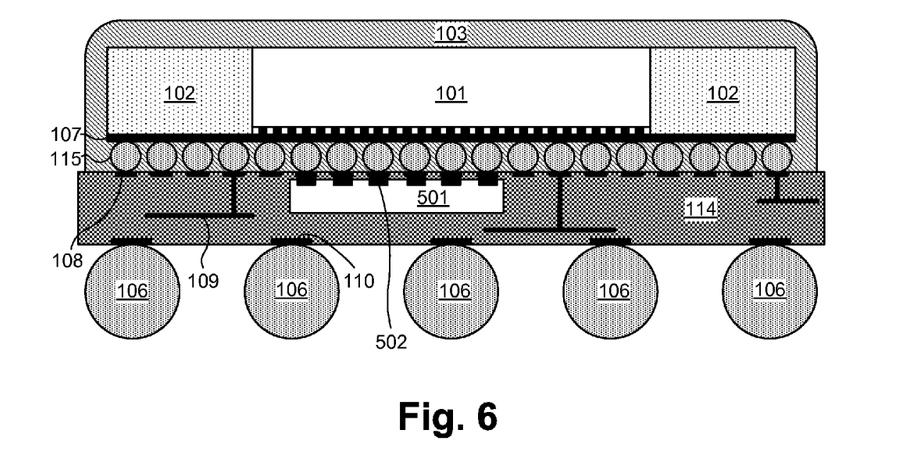
FIG. 6 is a side cutaway view of another example of a semiconductor device including an interposer-embedded device, in accordance with one or more aspects described herein.

FIG. 5 is a side cutaway view of an example of such a semiconductor device that includes an interposer-embedded circuit component, using copper cylinders 105 to connect between the RDL 107 and the interposer 114. FIG. 6 is a similar side cutaway view of an example a semiconductor device that includes the interposer-embedded circuit component, but instead uses solder bumps 115 to connect between the RDL 107 and the interposer 114. In addition to the previously-discussed elements of the semiconductor device described with regard to FIG. 1A, the present examples of FIGS. 5 and 6 also include a circuit component 501 disposed partially or fully within the interposer 114. As discussed above, the circuit component 501 may include one or more elements such as transistors, capacitors, resistors, transistors, memory elements, and/or the like, which may be embodied in a package such as in the form of a semiconductor chip.

The circuit component 501 may be positioned in the interposer 114 such that one or more electrical contacts 502 of the circuit component 501 may face and be directly electrically coupled with one or more of the electrical connectors 105/115. The electrical contacts 502 of the circuit component 501 may be laterally aligned and/or in direct physical contact with the respective electrical connectors 105/115. This alignment and direct face-to-face contact between the circuit component 501 and the electrical connectors 105/115 may allow for increased performance of the semiconductor device, e.g., by providing a potentially faster and/or more reliable signal link between the semiconductor chip 101 and the circuit component 501. However, in some embodiments, the circuit component 501 may be deeply embedded in the interposer 114 such that the circuit component 501 communicates with the semiconductor chip 101 via separate conductive lines, such as via interconnects 109, between the circuit component 501 and the electrical connectors 105/115. Additionally or alternatively, the circuit component 501 may be oriented such that some or all of the electrical contacts 502 of the circuit component 501 face away from the electrical connectors 105/115. For instance, if desired, the circuit component 501 may be embedded in a face-down orientation, where the electrical contacts 502 face toward the solder balls 106 of the BGA. However, such a face-down orientation may utilize additional interconnect lines and/or wires and so may not result in the relative performance improvements that may be potentially realized in the face-up orientation of the circuit component 501 (where the electrical contacts 502 face toward the electrical connectors 105/115), such as shown in FIG. 5.

Figure 7:
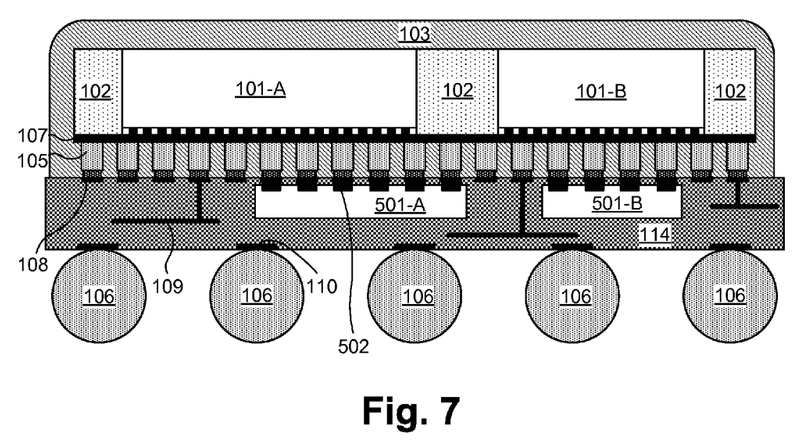
FIG. 7 is a side cutaway view of an example of a semiconductor device including multiple chip dies and multiple interposer-embedded devices, in accordance with one or more aspects described herein.
Figure 8:
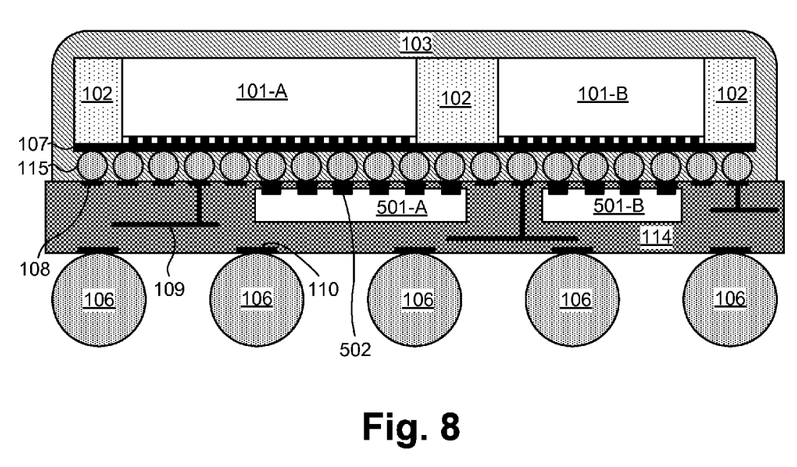
FIG. 8 is a side cutaway view of another example of a semiconductor device including multiple chip dies and multiple interposer-embedded devices, in accordance with one or more aspects described herein.

Further example embodiments are shown in FIGS. 7 and 8. The example of FIG. 7 shows a semiconductor device having two semiconductor chips 101-A and 101B and two interposer-embedded circuit components 501-A and 501-B. The example of FIG. 8 is similar to that of FIG. 7, except that the solder bumps 115 are used rather than the copper cylinders 105. As in the previous embodiments of FIGS. 5 and 6, the circuit components 501-A and 501-B may be partially or fully embedded in the interposer 114, and may be aligned so as to directly align and/or contact with desired ones of the electrical connectors 105/115.

Figure 9:
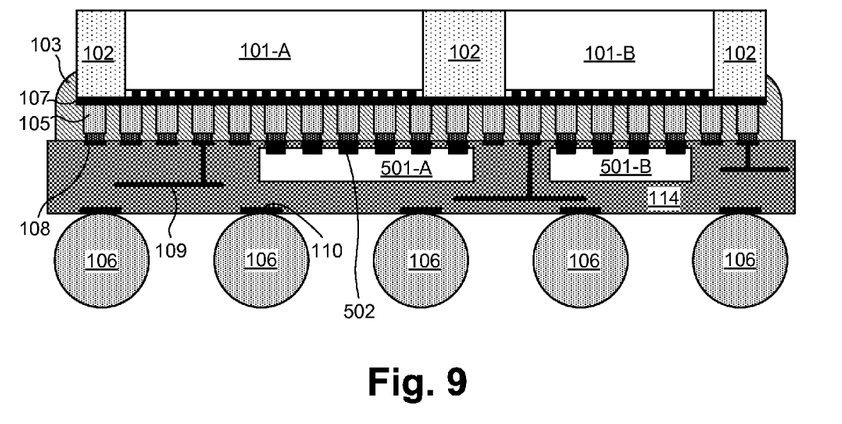
FIG. 9 is a side cutaway view of an example of a semiconductor device having a bare die backside.
Figure 10:
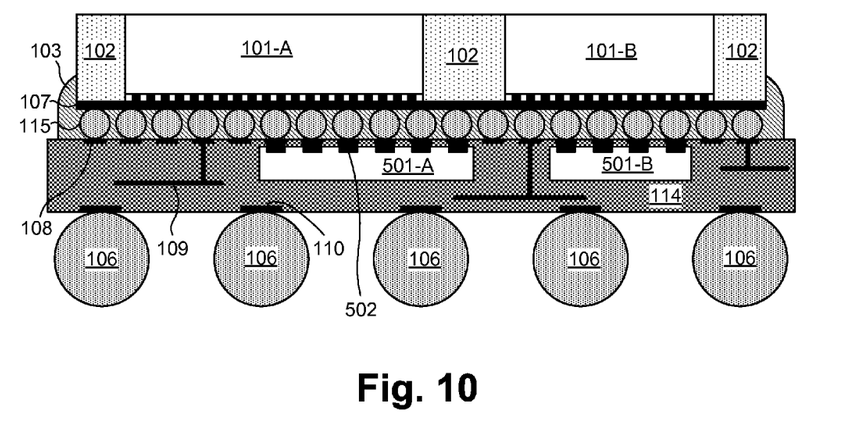
FIG. 10 is a side cutaway view of another example of a semiconductor device having a bare die backside.

FIGS. 9 and 10 illustrate yet further example embodiments. The example of FIG. 9 is similar to that of FIG. 7, except that the underfill material 103 does not cover the upper side of the semiconductor device. In such an embodiment, the surface 113 of the semiconductor chip(s) 101 facing away from the electrical connectors 105/115 may be exposed and/or partially or fully covered by another material, depending upon whether the above-mentioned grinding has been performed. The example of FIG. 10 is similar to that of FIG. 9, except that the solder bumps 115 are used rather than the copper cylinders 105. Also, while the embodiments of FIGS. 9 and 10 show multiple semiconductor chips 101 and multiple circuit components 501 embedded in the interposer 114, these embodiments may have any number of one or more semiconductor chips 101 and any number of zero or more circuit components 501.

Many other variations of the embodiments illustrated in the drawings are possible. For example, where multiple semiconductor chips 101 and/or multiple circuit components 501 are used, the interposer 114 may be divided into multiple separate interposers laid out side by side, such as one interposer per semiconductor chip 101 and/or one interposer per circuit component 501. And, although embodiments having particular numbers of semiconductor chips 101 and circuit components 501 are shown in the drawings, other embodiments may have any combination of quantities of semiconductor chips 101 and circuit components 501 (or lack thereof), as desired. For example, an embodiment may have only a single semiconductor chip 101 and two or more circuit components 501 embedded in one or more interposers 114. Or, an embodiment may have two or more semiconductor chips 101 and only a single circuit component 501 embedded in the interposer 114 (or embedded in one of multiple interposers 114). As another variation, the extension layer 102 may partially or completely cover the surface 113 of any of the one or more semiconductor chips 101 in any of the examples of FIGS. 5-10, similar to extension layer 102 configuration shown in FIGS. 2A and 2B.

FIGS. 11A-11D are side cutaway views showing examples of the interposer 114 during various steps of a process for manufacturing the interposer 114 while embedding one or more circuit components (such as the circuit component 501) in a face-up configuration in the interposer (such as the interposer 114). In this example manufacturing process, the interposer 114 is a PCB board. However, the interposer 114 may be made of alternative materials and configuration, and so the steps for embedding the circuit component 501 and manufacturing the interposer 114 may differ accordingly.

Figure 11A:
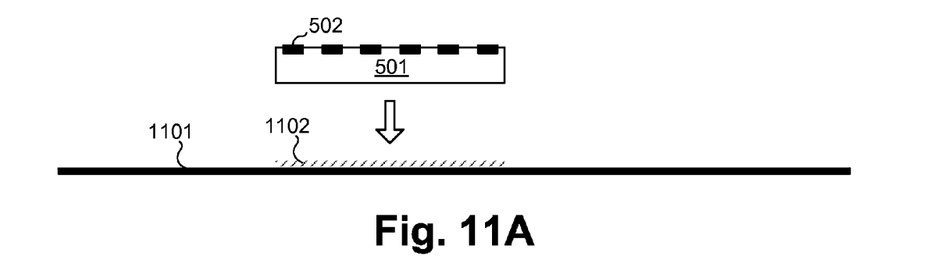
FIGS. 11A-11D are side cutaway views showing examples of a semiconductor device during various steps of a process for embedding one or more circuit components in an interposer, in accordance with one or more aspects described herein.

As shown in FIG. 11A, the circuit component 501 may be placed on a carrier 1101. The carrier 1101 may be made of an electrically conductive material, such as copper or another metal. The circuit component 501 may be attached to the carrier 1101 using an adhesive 1102. The circuit component 501 may be oriented such that the electrical contacts 502 face away from the carrier 1101. While only a single circuit component 501 is shown in this example, it will be understood that multiple circuit components 501 may be placed onto the carrier 1101 during this step or during another manufacturing step.

Figure 11B:
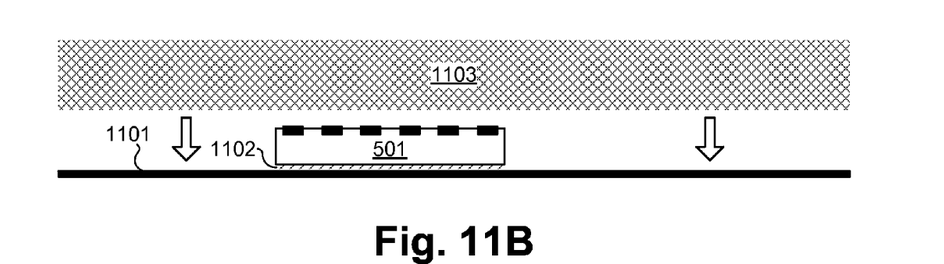

Next, as shown in FIG. 11B, a laminate material 1103, such as epoxy (into which paper or woven glass, for example, may be embedded), may be applied to the combined carrier and circuit component 501. The laminate material 1103 may thus cover the exposed surfaces of the circuit component 501 and the exposed surface of the carrier 1103 side that is facing the circuit component 501.

Figure 11C:
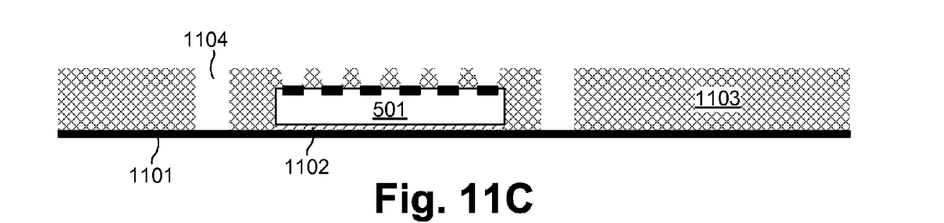

Next, as shown in FIG. 11C, one or more vias 1104 in the molding material 1103 may be formed, such as by laser drilling. The vias 1104 may be formed at strategic locations so as to align with, for example, one or more of the electrical contacts 502 and/or one or more regions in which a through via is desired to extend completely through the molding material 1103 down to the carrier 1101.

Figure 11D:
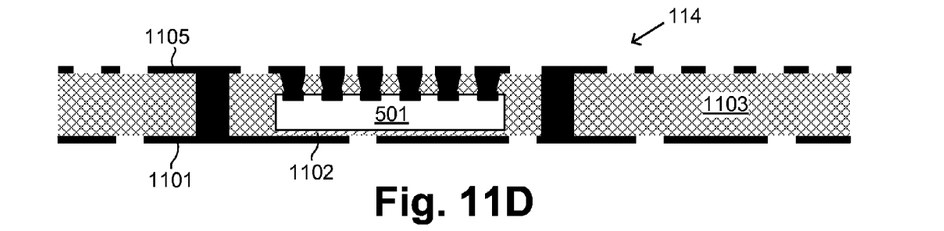

Next, as shown in FIG. 11D, the one or more vias 1104 may be filled with an electrically conductive material 1105, such as copper or another metal. The upper surface of the molding material 1103 may also be selectively coated in a pattern of the conductive material 1105, to form the electrical contacts 108 of the interposer 114. The carrier 1101 may also be patterned so as to form multiple different electrical regions that may form the electrical contacts 110 of the interposer 114.

The vias 1104 that extend completely through the molding material 1103 may be filled with the conductive material 1105 such that the conductive material 1105 electrically couples one or more portions of the carrier 1101 with one or more portions of the conductive material 1105. These vias may form at least a portion of the previously-mentioned interconnects 109 of the interposer 114. Other conventional manufacturing steps may be implemented to create more complex portions of the interconnects 109, as desired.

Once the interposer 114 with the embedded circuit component(s) 501 is created, the resulting interposer 114 may be used in a semiconductor device as described herein, such as in any of the semiconductor devices illustrated in FIGS. 1-3 and 5-10.

Thus, various examples have been described in which a fanout structure may be used to translate the pitch of a semiconductor chip to a lower intermediary pitch within a flip-chip package. This may eliminate the need for the expensive silicon or glass interposer that is conventionally used in 2.5D flip-chip packages. Rather, one may simply create an extension layer to provide a lateral fanout region, use an RDL on the combined semiconductor chip and extension layer to reduce the semiconductor chip pad pitch to a pitch that is compatible with a PCB interposer, and then couple a PCB or similar interposer to the RDL to further reduce the pitch as needed to a larger circuit board pitch and to closely match the CTE of the flip chip package to the CTE of the circuit board. Moreover, this may all be done in an inexpensive way using conventional flip-chip materials and conventional manufacturing techniques.

While various embodiments have been illustrated and described, there are merely examples. The words used in this specification are words of description rather than limitation, and it is understood that various changes may be made without departing from the spirit and scope of the present disclosure.

The invention claimed is:

1. A semiconductor device, comprising:
   a first semiconductor chip having at least one electrically conductive contact at a first side of the first semiconductor chip;
   an extension layer extending laterally from one or more sides of the first semiconductor chip;
   a redistribution layer disposed on a surface of the extension layer and the first side of the first semiconductor chip, the redistribution layer electrically coupling the at least one electrically conductive contact of the first semiconductor chip to at least one electrical connector; and
   an interposer electrically coupled to the at least one electrical connector and having a plurality of electrically conductive contacts at a surface of the interposer facing away from the redistribution layer; and
   a ball grid array disposed on the plurality of electrically conductive contacts of the interposer, wherein the at least one electrical connector comprises a plurality of copper pillars disposed between the redistribution layer and the interposer.

2. The semiconductor device of claim 1, further comprising a molding material at least partially enclosing the first semiconductor chip and the redistribution layer, and in physical contact with the interposer.

3. The semiconductor device of claim 1, wherein the at least one electrically conductive contact of the first semiconductor chip is part of a first plurality of electrically conductive contacts at the first side of the first semiconductor chip, and the at least one electrical connector is part of a plurality of electrical connectors electrically coupled to the interposer, and
   wherein a first pitch of the first plurality of electrically conductive contacts is smaller than a second pitch of the plurality of electrical connectors.

4. The semiconductor device of claim 3, wherein the first pitch is below a 100 micron pitch and the second pitch is at least a 150 micron pitch.

5. The semiconductor device of claim 3, wherein the second pitch is smaller than a third pitch of the ball grid array.

6. The semiconductor device of claim 1, further comprising a circuit component embedded in the interposer, the circuit component having at least one electrically conductive contact facing the first semiconductor chip.

7. The semiconductor device of claim 6, wherein the circuit component comprises a second semiconductor chip.

8. The semiconductor device of claim 1, wherein the at least one electrical connector is part of a plurality of electrical connectors electrically coupled to the interposer, at least one of the plurality of electrical connectors is disposed under the extension layer, and at least another of the plurality of electrical connectors is disposed under the first semiconductor chip.

9. The semiconductor device of claim 1, further comprising a second semiconductor chip having at least one electrically conductive contact at a first surface of the second semiconductor chip that is facing in a same direction as the first surface of the first semiconductor chip,
   wherein the extension layer further extends laterally from one or more sides of the second semiconductor chip, and
   wherein the redistribution layer is further disposed on the first surface of the second semiconductor chip, and
   wherein the at least one electrical connector is part of a plurality of electrical connectors electrically coupled to the interposer, and wherein the redistribution layer electrically couples the at least one electrically conductive contact of the second semiconductor chip to at least another of the plurality of electrical connectors.

10. A method for manufacturing a semiconductor device, the method comprising:
    forming a redistribution layer on a surface of a layer that comprises a first semiconductor chip and an extension layer, wherein the redistribution layer extends beyond a boundary of the first semiconductor chip;
    forming a plurality of electrical connectors on the redistribution layer, wherein at least one of the electrical connectors is within a boundary of the first semiconductor chip and at least another of the electrical connectors is disposed outside of the boundary of the first semiconductor chip;

connecting an interposer to the plurality of electrical connectors; and forming a ball grid array on a surface of the interposer that is opposite the plurality of electrical connectors, wherein a first pitch of electrically conductive contacts of the first semiconductor chip is smaller than a second pitch of the electrical connectors, and wherein the second pitch is smaller than a third pitch of the ball grid array, and wherein the plurality of electrical connectors comprises a plurality of copper cylinders.

11. The method of claim 10, further comprising enclosing at least a portion of the first semiconductor chip and the redistribution layer in a molding material, wherein the molding material further contacts the interposer, and wherein the ball grid array is exposed by the molding material.

12. The method of claim 10, wherein the interposer comprises a PCB interposer.

13. The method of claim 10, further comprising embedding a second semiconductor chip in the interposer.

* * * * *